ADMINISTRATOR OF THE NATIONAL AERONAUTICS
AND SPACE ADMINISTRATION
TUNING ARRANGEMENT FOR AN ELECTRON DISCHARGE DEVICE OR THE LIKE
Filed Jan. 17, 1968

VINCENT J. MARTUCCI
*INVENTOR.*
*BY* [signature]
[signature]
ATTORNEYS

United States Patent Office 3,541,479

Patented Nov. 17, 1970

3,541,479

TUNING ARRANGEMENT FOR AN ELECTRON DISCHARGE DEVICE OR THE LIKE

James E. Webb, Administrator of the National Aeronautics and Space Administration, with respect to an invention of Vincent J. Martucci, Beverly, Mass.

Filed Jan. 17, 1968, Ser. No. 698,630

Int. Cl. H01p *7/06;* H01j *23/20*

U.S. Cl. 333—83 10 Claims

ABSTRACT OF THE DISCLOSURE

A tuning arrangement consisting of a tuning sleeve to which a tuning element is attached. The alignment and rigidity of the sleeve are controlled by a retainer to which a bellows is attached to provide a vacuum seal. Axial motion of the sleeve is provided by a shaft axially movable by a gear assembly. A locking arrangement is provided to eliminate gear backlash and to provide a positive locking force on the shaft after tuning in order to maintain the arrangment locked in place even under severe vibration and shock.

ORIGIN OF THE INVENTION

The invention described herein was made in the performance of work under a NASA contract and is subject to the provisions of Section 305 of the National Aeronautics and Space Act of 1958, Public Law 85–568 (72 Stat. 435; 42 USC 2457).

BACKGROUND OF THE INVENTION

Field of the invention

This invention relates to an electron discharge device and, more particularly, to a tuning arrangement for a magnetron-type device.

Description of the prior art

The use of a tuning element to control the frequency of operation of an electron discharge device, such as a magnetron in conjunction with which the present invention will be described, is well known. Basically, tuning is achieved by selectively controlling the position of metallic or dielectric elements within cavities, formed by electrodes such as the anode of the magnetron. If the frequency of operation of the magnetron is not critical or the magnetron is easily accessible for frequent maintenance, a relatively simple arrangment may be employed to control the position of the tuning elements within the device.

If, however, a very precise frequency is required of the magnetron and it is not accessible for frequent maintenance, it is necessary to position the tuning elements very precisely and furthermore insure that once so positioned, they remain set without requiring subsequent adjustments. For example, in a magnetron used in a spacecraft or satellite, it is most important to be able to precisely tune the magnetron before the flight and insure its proper and continuous tuning during the flight under the severe environmental conditions to which the magnetron may be subjected, such as vibration, shock and a relatively large range of temperatures.

For example, in a magnetron employed in one of the lunar exploration spacecrafts, a dielectric tuning ring has been used to tune the frequency at a rate of 18 megacycles per .001 inch. In such a device, it is necessary to move the tuning ring at a very slow travel rate when setting the magnetron to a specifically desired frequency. Furthermore, once set, it is important that the tuning arrangement maintain the tuning ring at the set position so that the output frequency of the magnetron is within $\pm 1$ mc throughout the vibration, shock and specific temperature ranges to which the exploration spacecraft may be subjected. To meet the above requirements, existing tuning arrangements have been used but have been found to be quite inadequate.

Therefore, a new arrangement for precisely tuning a magnetron for use in space exploration and in any other application where precise tuning with minimum maintenance is desired, is necessary.

OBJECTS AND SUMMARY OF THE INVENTION

Accordingly, it is a primary object of the present invention to provide a new arrangement for tuning a magnetron or like device.

Another object of the present invention is to provide a novel arrangement with which a tuning element may be precisely positioned and secured within a magnetron for tuning the frequency thereof.

A further object of the present invention is to provide a new arrangement for securely positioning a tuning element in a magnetron and maintain it at the selected position even under relatively severe environmental conditions.

These and other objects of the present invention are achieved by providing an arrangement consisting of a tuning sleeve to which a tuning element, such as a ceramic ring, is attached at one end. The other end of the tuning sleeve is connected to one end of a bellows which is substantially enclosed within a bellows retainer. The retainer also encloses the tuning sleeve which slides within the retainer so that the sleeve's rigidity and alignment is precisely maintained. The other end of the bellows is also connected to the head of the bellows retainer and thereby maintains the vacuum within the interior of the device or tube, while allowing vertical movement of the tuning sleeve with respect to the housing.

As will be explained hereafter in detail, the bellows retainer and tuning sleeve are so designed that accurate alignment and rigidity of the tuning sleeve within the bellows retainer is maintained while allowing free movement of the tuning sleeve within the vacuum without galling. Attached to the other end of the tuning sleeve is a tuning shaft which is axially movable by means of rotatable gears to which the shaft is threadably meshed. A locking assembly is also included in the novel arrangement of the present invention to provide sufficient balancing torque to the shaft in order to eliminate any backlash in the tuning mechanism as well as to halt the tuning shaft and thereby produce the accurate positioning of the tuning element within the magnetron during the severe environmental conditions to which the magnetron may be subjected.

The novel features that are considered characteristic of this invention are set forth with particularity in the appended claims. The invention will best be understood from the following description when read in connection with the acccompanying drawings.

DESCRIPTION OF THE PREFERRED EMBODIMENT

Figure 1:
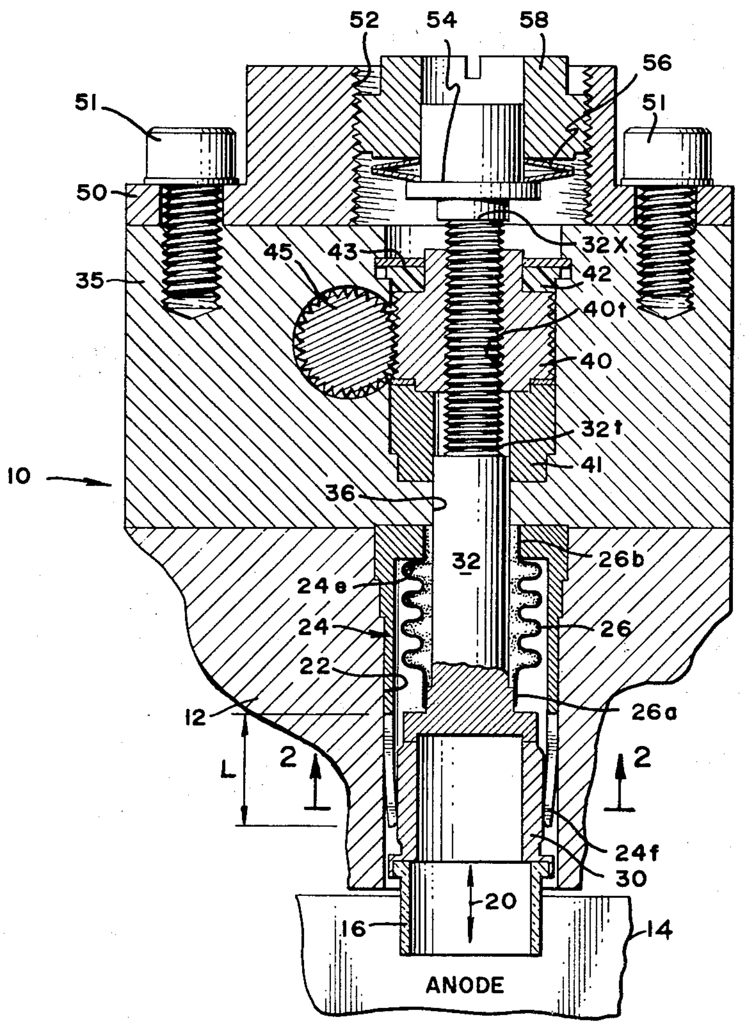
FIG. 1 is a simplified cross-sectional view of the tuning arrangement of the present invention.

Referring to FIG. 1, there is shown a magnetron 10 having a housing 12, in which conventional elements of a magetron tube are assumed to be located. For explanatory purposes, only an anode 14 is shown since tuning of the magnetron is generally accomplished by cotrolling the position of one or more tuning elements with respect to cavities formed in the anode. In the drawing, such a tuning element is represented by a cylindrical tuning ring 16. The ring, which in one embodiment is of ceramic, serves as a dielectric material which when moved within an anode cavity tunes the magnetron. It is assumed that tuning is accomplished by varying the position of the ring along axial axis 20.

The housing 12 defines a cylindrical aperture 22 whose longitudinal axis coincides with that of axis 20. A retainer 24 in the form of a hollow cylinder is securely fixed in opening 22. The function of the retainer 24 is to protect a bellows 26 movable therein, as well as to control the rigidity and alignment of a tuning sleeve 30 to which the ring 16 is attached at one end. It is the axial motion of the sleeve 30 which is controlled and transferred to the ring 16 to precisely position it within the housing 12.

The end of sleeve 30, opposite the end to which the ring 16 is attached, is connected to a lower end of a tuning shaft 32, which forms a header for end **26*a* of bellows 26. The other end of the bellows 26, designated 26*b*, is connected to retainer 24, at the end near the exterior surface of housing 12. This end, designated 24*e*, may be thought of as an apertured closed end of the retainer 24. The shaft 32 extends out of housing 12 through the aperture in end 24*e***.

The function of the bellows 26 is to maintain the vacuum within the housing 12, while allowing axial movement of the tuning shaft 32 and sleeve 30. From the figure, it should be apparent that the ring 16, sleeve 30 and the exterior surface of the bellows are at the vacuum pressure within the housing, while the interior surface of the bellows and shaft 32 are at the pressure, exterior to housing 12.

A tuning housing 35 is fastened by conventional means (not shown) to the housing 12. The portion of shaft 32 which extends out of bellows 26 is aligned with the longitudinal axis of a cylindrical opening 36 in the tuning housing 35.

The cylindrical opening 36 is utilized to support a helical gear 40 between a pair of blocks or bearings 41 and 42 secured in position by a fastening device, such as a snap ring 43. The helical gear defines a central opening which is threaded with teeth **40*t*. The gear is rotatable about an axis, aligned with the longitudinal axis of shaft 32 which extends through the gear 40. The exterior surface of the portion of the shaft extending through the gear 40 is threaded with teeth 32*t* which are meshed with teeth 40*t*. Thus, rotational motion of the gear 40 is translated into axial motion of shaft 32, sleeve 30 and most significantly tuning ring 16. A mating gear 45, supported in housing 35, is meshed to the exterior surface of the helical gear 40** to rotate the latter at any desired mechanical reduction.

Figure 2:
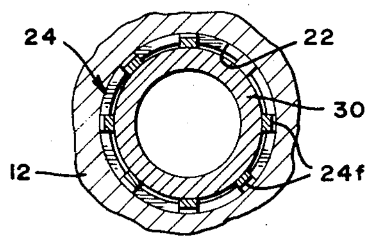
FIG. 2 is a cross-sectional view along line 2—2 of FIG. 1.

To insure the proper alignment of ring 16, the tuning sleeve 30 which supports it must be properly aligned with a minimum of play, within the retainer 24, yet be able to freely, axially move therein. This is accomplished by fabricating the retainer from hard steel, such as 420 stainless steel with the inner surface thereof defining slotted segments to form fingers. These fingers are squeezed and hardened to produce interfering tolerances on a minimum circumferential surface between the inner diameter (ID) of the retainer and outer diameter (OD) of the sleeve 30. The fingers, in addition to eliminating radial misalignment of the sleeve, allow for free movement of the sleeve in the vacuum environment without galling. FIG. 2 is a cross-sectional view along line 2—2 of FIG. 1. Therein, the fingers are designated by numerals **24*f***. Their length is designated in FIG. 1 by an arrow L.

One of the undesirable features of prior art tuning arrangements in which gears are used to convert one type of motion, such as rotational to axial motion of the tuning element, is backlash in the gear assembly. Such backlash is particularly present when the magnetron is subjected to vibration and shock. In the present invention, this source of tuning error is eliminated by incorporating in the arrangement a locking assembly which applies a force to top **32*x* of shaft 32 extending out of the tuning housing 35**.

The locking assembly is diagrammed in FIG. 1 and is shown comprising a locking housing 50, secured to tuning housing 35 by fastening screws 51. Top **32*x* of tuning shaft 32 extends into a central, internally threaded opening 52 in housing 50. A stud 54 is mounted on the top 32*x* and is biased against it by a biasing spring, such as a Belleville washer 56. A locking screw 58 is threadable in opening 52 to exert a downward force on the shaft 32 by means of the washer 56 and stud 54**.

In practice, the Belleville washer 56 acts as a downward biasing spring which allows the tuning of the magnetron by the axial alignment of ring 16, while maintaining a high torque force on the tuning shaft 32. Such force completely eliminates any backlash in the tuning mechanism. After the tuning is completed, locking screw 58 is further tightened, providing an additional locking force on the tuning shaft 32. As a result, the shaft 32, and sleeve 30 to which the tuning ring 16 is attached remain securely in place even under relatively severe vibration and shock. To minimize frequency changes due to temperature variations, all materials used in the arrangement are selected to compensate for the overall expansion or contraction of the tuning assembly which may be expected to occur as a result of extreme temperature changes and heat radiated by the magnetron in operation. The use of such a locking assembly and the guiding of the tuning sleeve 30 in retainer 24 have been found to greatly contribute to the advantages of this tuning arrangement over prior art assemblies.

There has accordingly been shown and described herein a novel arrangement for tuning an electron discharge device, such as a magnetron, by accurately positioning a tuning element therein. It is appreciated that those familiar with the art may make modifications and/or substitute equivalents in the arrangement as shown without departing from the spirit of the invention. Therefore, all such modifications and/or equivalents are deemed to fall within the scope of the invention as claimed in the appended claims.

What is claimed is:

1. In an electron discharge device of the type including a tuning member for controlling the frequency of operation of said device, an arrangement for controlling the position of said member in said device comprising:

a housing of said device defining an opening;

a cylindrical sleeve having first and second ends;

a tuning member coupled to the first end of said sleeve and extending into said device through the opening in the housing thereof;

a bellows;

a cylindrical tuning shaft coupled at one end thereof to the second end of said sleeve and to one end of said bellows, said shaft extending through said bellows from a second end thereof;

retainer means coupled to said housing for connecting the second end of said bellows to said housing and for frictionally engaging the outer surface of said sleeve between the first and second ends thereof, the external surface of a portion of said tuning shaft extending from said bellows being screw threaded; and control means for controlling the lateral position of said shaft along its longitudinal axis, said control means including gear means meshed with the threads on the surface of said shaft.

2. The arrangement as recited in claim 1 further including locking means coupled to the tuning shaft at an end, opposite said one end, for exerting a force on said tuning shaft directed toward said one end so as to minimize backlash between said tuning shaft and the gear means with which it is meshed.

3. The electron discharge device as recited in claim 1 wherein said retainer means defines a plurality of inwardly extending fingers for frictionally engaging the outer surface of said sleeve.

4. In an electron discharge device of the type including a tuning member for controlling the frequency of operation of said device, an arrangement for controlling the position of said member in said device comprising:

a housing of said device defining an opening;
a cylindrical sleeve having first and second ends;
a tuning member coupled to the first end of said sleeve and extending into said device through the opening in the housing thereof;
a bellows;
a cylindrical tuning shaft coupled at one end thereof to the second end of said sleeve and to one end of said bellows, said shaft extending through said bellows from a second end thereof;
retainer means connecting the second end of said bellows to said housing, the external surface of a portion of said tuning shaft extending from said bellows being screw threaded;
control means for controlling the lateral position of said shaft along its longitudinal axis, said control means including gear means meshed with the threads on the surface of said shaft; and
locking means coupled to the tuning shaft at an end, opposite said one end, for exerting a force on said tuning shaft directed toward said one end so as to minimize backlash between said tuning shaft and the gear means with which it is meshed, said locking means including a stud, a biasing spring and a locking screw for applying a force to said biasing spring to bias said stud to be in contact with and apply said force to said tuning shaft.

5. In an electron discharge device of the type including a tuning member for controlling the frequency of operation of said device, an arrangement for controlling the position of said member in said device comprising:

a housing of said device defining an opening;
a cylindrical sleeve having first and second ends;
a tuning member coupled to the first end of said sleeve and extending into said device through the opening in the housing thereof;
a bellows;
a cylindrical tuning shaft coupled at one end thereof to the second end of said sleeve and to one end of said bellows, said shaft extending through said bellows from a second end thereof;
retainer means connecting the second end of said bellows to said housing, the external surface of a portion of said tuning shaft extending from said bellows being screw threaded;
control means for controlling the lateral position of said shaft along its longitudinal axis, said control means including gear means meshed with the threads on the surface of said shaft; and
locking means coupled to the tuning shaft at an end, opposite said one end, for exerting a force on said tuning shaft directed toward said one end so as to minimize backlash between said tuning shaft and the gear means with which it is meshed, said retainer means comprising a substantially hollow cylinder, the outside surface thereof being in contact with said housing in the opening thereof, said sleeve extending through said hollow cylinder and frictionally engaging the inner surface thereof, whereby said cylinder controls the alignment and axial movement of said sleeve and the tuning member coupled thereto.

6. The electron discharge device as recited in claim 5 wherein the hollow cylinder comprising said retainer means defines a plurality of longitudinal fingers which frictionally engage the outer surface of said sleeve.

7. In an electron discharge device of the type including a tuning member for controlling the frequency of operation of said device as a function of its position within the device, an arrangement for controlling the position of said member through an opening in the housing of the device comprising:

a substantially hollow cylindrical retainer element fixedly positioned and axially aligned in the opening of said housing;
a tuning sleeve retained in and maintained by said retainer element, by frictional engagement therewith, said sleeve being axially movable within said retainer element having a first end in the housing of said device;
a tuning member connected to said first end of said tuning sleeve;
a tuning shaft coupled to said tuning sleeve, said shaft having a portion thereof extending out of said retainer element;
flexible vacuum sealing means in said retainer element, having one end coupled to a second end of said tuning sleeve and an end, opposite said one end, coupled to said retainer element whereby the interior of said vacuum sealing means and said tuning shaft in a first vacuum environment and the exterior of said vacuum sealing means, the interior of the retainer element and the exterior of said tuning sleeves which frictionally engages said retainer element are in a second vacuum environment;
a tuning assembly coupled to said housing and including position control means coupled to the shaft extending from said retainer element for controlling the axial position of said tuning shaft; and
a locking assembly having a housing fixedly connected to said tuning assembly and biasing means for applying a locking force on said shaft to retain it in the axial position determined by said position control means.

8. The electron discharge device as recited in claim 7 wherein the retainer element defines a plurality of fingers which frictionally engage said tuning sleeve.

9. In an electron discharge device of the type including a tuning member for controlling the frequency of operation of said device as a function of its position within the device, an arrangement for controlling the position of said member through an opening in the housing of the device comprising:

a substantially hollow cylindrical retainer element fixedly positioned and axially aligned in the opening of said housing;
a tuning sleeve retained in and maintained by said retainer element, said sleeve being axially movable within said retainer element having a first end in the housing of said device;
a tuning member connected to said first end of said tuning sleeve;
flexible vacuum sealing means in said retainer element, having one end coupled to a second end of said tuning sleeve and an end, opposite said one end, coupled to said retainer element;
a tuning shaft coupled to said tuning sleeve, said shaft having a portion thereof extending out of said retainer element;
a tuning assembly coupled to said housing and including position control means coupled to the shaft extending from said retainer element for controlling the axial position of said tuning shaft; and
a locking assembly having a housing fixedly connected to said tuning assembly and biasing means for applying a locking force on said shaft to retain it in the axial position determined by said position control means, the housing of said locking assembly defining an aperture threaded about the interior surface thereof, a locking screw threadably engaging the housing of the locking assembly, a stud in contact with the top of said tuning shaft and spring means, between said stud and screw for biasing said stud against said shaft to apply the locking force thereto.

10. The arrangement as recited in claim 9 wherein said spring means is a Belleville spring and said position control means includes a rotatable gear threadably coupled to said shaft to control the axial position thereof.

References Cited

UNITED STATES PATENTS

| | | | |
|---|---|---|---|
| 2,466,060 | 4/1949 | Spencer | 333—83 |
| 2,752,576 | 6/1956 | Hilliard et al. | 333—83 |
| 2,837,685 | 6/1958 | Dalman | 333—83 X |
| 2,884,602 | 4/1959 | Speake et al. | 333—83 X |
| 2,911,602 | 11/1959 | Hayter | 333—83 |
| 2,996,690 | 8/1961 | St. Clair | 333—83 |
| 3,444,486 | 5/1969 | Banes et al. | 333—83 |

ELI LIEBERMAN, Primary Examiner

W. N. PUNTER, Assistant Examiner

U.S. Cl. X.R.

315—5.53, 39.61